US006728989B2

(12) United States Patent
Lerner et al.

(10) Patent No.: US 6,728,989 B2
(45) Date of Patent: May 4, 2004

(54) LABYRINTH SEAL FOR BEARING IN BRUSH MOUNTING ASSEMBLY FOR SEMICONDUCTOR WAFER SCRUBBER

(75) Inventors: Alexander Lerner, San Jose, CA (US); John M. White, Hayward, CA (US); Shou-Sang Chang, Stanford, CA (US); Michael Sugarman, San Francisco, CA (US)

(73) Assignee: Applied Materials Inc., Santa Clara, CA (US)

( * ) Notice: Subject to any disclaimer, the term of this patent is extended or adjusted under 35 U.S.C. 154(b) by 307 days.

(21) Appl. No.: 09/771,086

(22) Filed: Jan. 27, 2001

(65) Prior Publication Data

US 2002/0100131 A1 Aug. 1, 2002

(51) Int. Cl.[7] .............................................. A46B 13/04
(52) U.S. Cl. .............................. 15/21.1; 15/77; 15/88.3; 277/423; 384/480
(58) Field of Search ..................... 15/21.1, 77, 88.3, 15/24, 50.3; 277/411, 412, 423; 384/144, 480

(56) References Cited

U.S. PATENT DOCUMENTS

| 1,748,414 A | * | 2/1930 | Gibson et al. .............. 384/480 |
| 2,509,957 A | * | 5/1950 | Briggs ....................... 15/77 X |
| 2,739,429 A | * | 3/1956 | Peterson .................... 15/77 X |
| 3,129,960 A | * | 4/1964 | Schrodt ................. 277/412 X |
| 3,519,277 A | * | 7/1970 | Crocker .................. 277/423 X |
| 3,679,277 A | * | 7/1972 | Dohmen ...................... 384/480 |
| 3,774,982 A | * | 11/1973 | Nakamura et al. .......... 384/480 |
| 4,326,619 A | | 4/1982 | Garnett .......................... 193/37 |
| 4,348,067 A | * | 9/1982 | Tooley ........................ 384/480 |
| 4,557,506 A | | 12/1985 | Hanks et al. ................. 285/39 |
| 4,972,939 A | * | 11/1990 | Uttke et al. ................. 384/480 |
| 5,036,625 A | | 8/1991 | Gosis .......................... 451/286 |
| 5,342,282 A | * | 8/1994 | Letourneur ............. 384/480 X |
| 5,375,291 A | * | 12/1994 | Tateyama et al. ......... 15/88.3 X |
| 5,527,209 A | | 6/1996 | Volodarsky et al. ......... 451/388 |
| 5,701,625 A | * | 12/1997 | Siman ......................... 15/21.1 |
| 5,707,186 A | | 1/1998 | Gobell et al. ............... 409/136 |
| 5,715,557 A | * | 2/1998 | Hsu ........................... 15/50.3 |
| 5,749,584 A | | 5/1998 | Skinner et al. .......... 415/173.5 |
| 5,829,087 A | | 11/1998 | Nishimura et al. .......... 15/88.2 |
| 5,901,643 A | | 5/1999 | Bornhorst .................... 100/282 |
| 6,082,377 A | | 7/2000 | Frey ................................ 134/6 |

OTHER PUBLICATIONS

Patent Abstracts of Japan, Application No. 54063613, Dated Apr. 12, 1980.

* cited by examiner

*Primary Examiner*—Mark Spisich
(74) *Attorney, Agent, or Firm*—Dugan & Dugan

(57) ABSTRACT

A wafer scrubbing unit includes a mounting assembly for a scrubber brush. The mounting assembly has a rotary flow through tube through which cleaning liquid is delivered to the brush. A stationary tube may be mounted in the bore of the rotary tube. Spinning shields mounted on the rotary tube form labyrinth seals to protect a bearing housing from the cleaning liquid. Bearings for rotatably mounting the rotary tube are mounted within the housing.

27 Claims, 2 Drawing Sheets

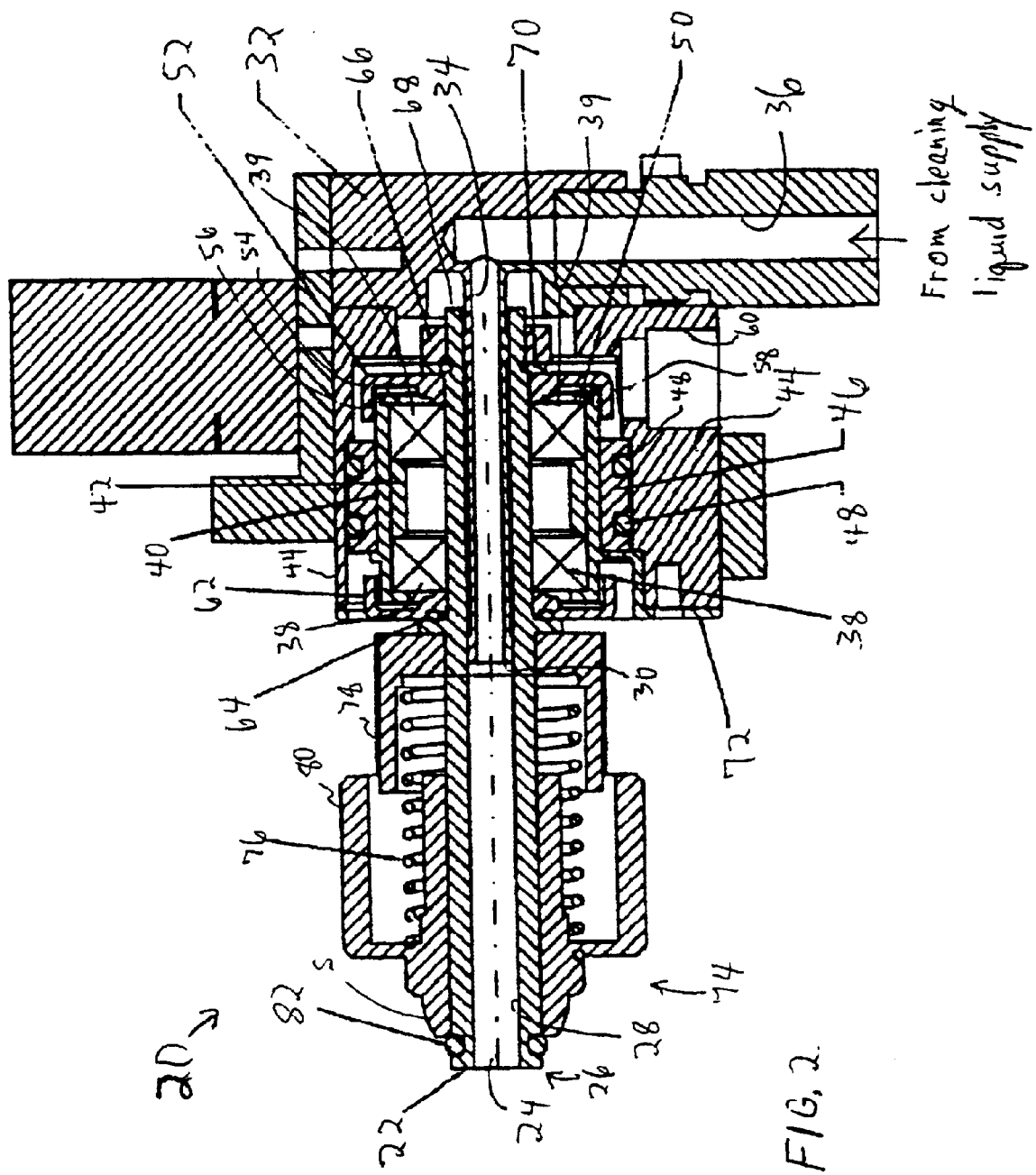

LABYRINTH SEAL FOR BEARING IN BRUSH MOUNTING ASSEMBLY FOR SEMICONDUCTOR WAFER SCRUBBER

FIELD OF THE INVENTION

The present invention is generally concerned with apparatuses for cleaning thin substrates such as semiconductor wafers, compact discs, flat panel displays and the like. More particularly, the invention is concerned with brush apparatuses for cleaning thin substrates.

BACKGROUND OF THE INVENTION

For fabrication of semiconductor devices, thin slices or wafers of semiconductor material require polishing by a process that applies an abrasive slurry to the wafer's surfaces. After polishing, slurry residue is generally cleaned or scrubbed from the wafer surfaces via mechanical scrubbing devices, such as brushes made from porous or sponge-like material.

A brush apparatus for cleaning disks is described in co-pending U.S. patent application Ser. No. 09/580,879, filed May 30, 2000 and assigned to the present assignee, entitled "Brush Core for Disk Scrubbing Apparatus and Method for Use Thereof". The teachings of this prior application are incorporated herein by reference.

FIG. 1 is a schematic side perspective view of a scrubbing device 10 for wafer cleaning of the type disclosed in the above-referenced prior patent application. The scrubbing device 10 includes first and second brush rollers, 13a and 13b, which are positioned to contact both sides of a wafer W. A known mechanism 17, such as a motor, is operatively coupled to the first and second brush rollers, 13a and 13b, so as to selectively rotate the first and second brush rollers, 13a and 13b. Also, the wafer W is supported on rotating wheels 19a–19c for both supporting and rotating the wafer W.

In operation, the first and second brush rollers 13a and 13b are initially in an open position, at a sufficient distance from each other so as to allow a wafer to be inserted therebetween. Thereafter, the wafer W to be cleaned is positioned on the rotating wheels 19a–c between the first and second brush rollers, 13a and 13b, and the brush rollers assume a closed position, sufficiently close to each other so as to both hold the wafer W in place therebetween and to exert a force on the wafer surfaces adequate to achieve effective cleaning.

The motor 17 causes the first and second brush rollers, 13a and 13b to spin. Preferably the brush rollers spin in opposite directions, as indicated by arrows S1 and S2 in FIG. 1 applying forces to the wafer in a downward direction while the wafer rotates, so as to drive the wafer into the rotating wheels 19a–19c so that the wafer remains engaged by the rotating wheels.

While the pair of brush rollers spin, the rotating wheels 19a–19c which engage the wafer's edge rotate causing the wafer to rotate. Rotation of the wafer W helps to ensure that the pair of brush rollers thoroughly contact and clean the entire surface of the wafer W. In addition, a cleaning liquid such as de-ionized water is supplied to the wafer surface through perforations in the brush surface to assist in the removal of contaminants.

In FIG. 1, the brushes 13a and 13b have been schematically illustrated as positioned against the wafer W without supporting structure for mounting the brushes. However, as will be recognized by those who are skilled in the art, in a practical embodiment of a wafer scrubber, there must be provided suitable mechanisms for rotatably mounting the brushes in place, transmitting rotary motion to the brushes from a motor, and supplying cleaning liquid to the brushes. According to known techniques, each brush is mounted on a rigid core and a respective mounting assembly is provided to rotatably support each end of the rigid core. One of the mounting assemblies may be motor driven to impart motion to the rigid core and the mounted brush via the driven mounting assembly. The portion of the other mounting assembly which is connected to the rigid core has rotary motion transmitted thereto by the rigid core. It is known to supply cleaning liquid to the brush through the mounting assembly that is not motor driven.

In accordance with conventional practice, the portion of the mounting assembly that rotates with the brush is mounted on a bearing. Reliable and satisfactory operation of the scrubbing device requires that the cleaning liquid be kept away from the bearing. If the cleaning liquid were to reach the bearing, it could degrade the performance of the bearing, and also could result in lubricant from the bearing being transmitted to the wafer. For that reason, it is known to provide a seal between the source of the cleaning liquid and a bearing assembly. However, the seals that have been used in conventional brush mounting assemblies have been found to be a source of particle contamination. Moreover, such seals tend to degrade and leak over time, leading to bearing breakdown and contamination of the wafer by lubricant from the bearing.

SUMMARY OF THE INVENTION

In accordance with the invention, a mounting assembly for a wafer-scrubber brush includes a first tube that is fixedly mounted and has a bore in which a cleaning liquid flows, and a second tube having a bore in which the first tube is inserted. The inventive mounting assembly includes at least one bearing adapted to mount the second tube for rotational motion, and a housing in which the at least one bearing is fixedly mounted. Further included in the inventive mounting assembly are an assembly block in which the housing is mounted, and a first shield mounted on the second tube and adapted to rotate with the second tube. The first shield defines a gap between the first shield and the housing, and the gap is dimensioned so as to discourage flow of the cleaning liquid in the gap.

Further in accordance with the invention, the mounting assembly may include a drainage opening formed in the assembly block and extending downwardly from a location adjacent the first shield.

The first shield, which is rotationally mounted with the second tube, forms a virtual or labyrinth seal relative to the housing in which the bearing is mounted. Because the seal is virtual, and is therefore not in contact with the housing, this virtual seal does not generate particles which may contaminate the wafer. At the same time, the cleaning liquid is kept away from the bearing so that the life of the bearing is not shortened, and there is no contamination of the wafer by the bearing lubricant.

Other objects, features and advantages of the present invention will become more fully apparent from the following detailed description of the preferred embodiments, the appended claims, and the accompanying drawings.

BRIEF DESCRIPTION OF THE DRAWINGS

FIG. 2 is a side cross-sectional view of a brush mounting assembly provided in accordance with the invention.

DETAILED DESCRIPTION OF THE PREFERRED EMBODIMENT

Figure 1:
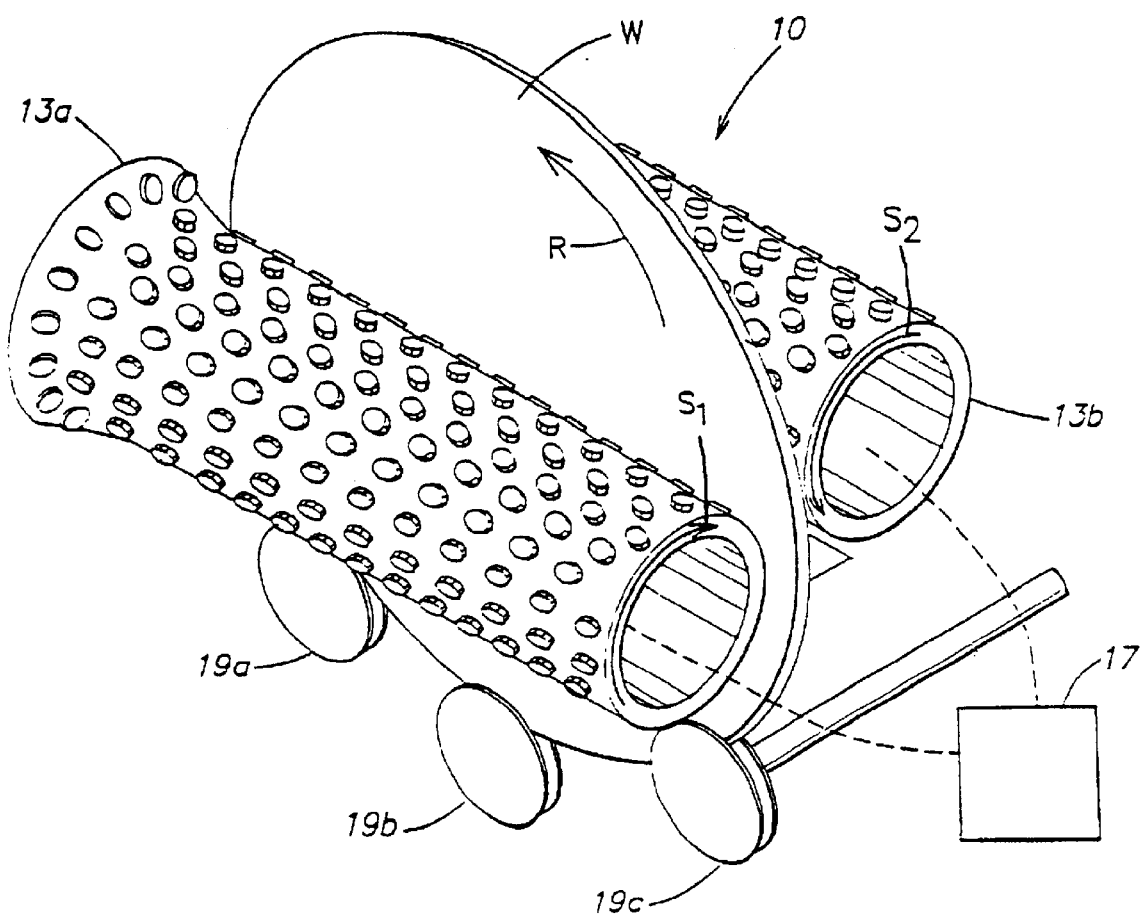
FIG. 1 is a schematic side perspective view of a wafer scrubbing device to which the present invention may be applied.

FIG. 2 is a side cross-sectional view of a mounting assembly that may be used to mount one end of one of the brushes shown in FIG. 1. As will be seen, in addition to rotatably mounting an end of the brush, the mounting assembly of FIG. 2 also supplies cleaning liquid to the brush.

Reference numeral 20 generally indicates the mounting assembly of FIG. 2. The mounting assembly 20 includes a substantially cylindrical flow through tube or shaft 22. As will be seen, flow through shaft 22 is mounted for rotation around its longitudinal axis, which is represented in the drawing by dot-dash line 24. The flow through shaft 22 serves as a supply tube for supplying cleaning liquid to the scrubber brush 13, which is not shown in FIG. 2. As will be appreciated by those who are skilled in the art, the longitudinal axis of the scrubber brush, when mounted to the mounting assembly 20, preferably is substantially positioned so as to extend in line with the longitudinal axis 24 of the flow through shaft 22. When mounted to the mounting assembly 20, an end of the scrubber brush's mandrel mates with a shoulder portion S of the mounting assembly 20.

The flow through shaft 22 has an inner bore 28. Inserted in the inner bore 28 of the flow through shaft 22 is another tube 30 which is fixedly mounted in flow through block 32. Tube 30 is hollow and is mounted so that its longitudinal axis substantially coincides with the longitudinal axis 24 of the flow through shaft 22. The tube 30 has an inner bore 34 which is in fluid communication with a liquid supply channel 36.

The tube 30 has an outer diameter that is slightly smaller than the inner diameter of the flow through shaft 22. The dimensioning of the tube 30 and the flow through shaft 22 is carefully controlled so that an outer surface of the tube 30 forms a gap of from 0.001 to 0.005 inch relative to the bore 28 of the flow through shaft 22.

The flow through shaft 22 is mounted for rotation about its longitudinal axis 24 by means of bearings 38, 39. The bearings 38, 39 are preferably greased stainless steel ball bearings. The bearings 38, 39 are, in turn, mounted in a housing 40. A spacer 42 is provided within the housing 40 and between the bearings 38, 39 to maintain a spacing between the bearings. The housing 40 is mounted in a bearing assembly block 44 by means of a flexure mounting 46. The flexure mounting 46 flexes to accommodate potential axial misalignment of the flow through shaft 22. O-rings 48 are installed between the flexure mounting 46 and the bearing assembly block 44. An internal ring 50 is provided in the housing 40 to hold the bearings 38, 39 in place.

To prevent cleaning liquid from leaking into the housing 40, a first shield 52 is provided at the side of the housing 50 furthest from the scrubber brush. The first shield 52 is secured to the flow through shaft 22 for rotation with the flow through shaft. The first shield 52 is shaped and positioned relative to the housing 40 so as to form a narrow labyrinthine gap relative to an outer surface of the housing 40. Preferably the gap between the first shield 52 and the housing 40 is about 0.030 inch wide and has a right angle portion formed by a corner 54 of the shield 52 and a corner 56 of the housing 40.

Adjacent a bottom end 58 of the first shield 52 a drainage opening 60 is formed in the bearing assembly block 44. The drainage opening 60 extends downwardly from a point near the bottom end 58 of the shield 52.

A second shield 62 is mounted for rotation on the flow through shaft 22 at an opposite side of the housing 40 from the first shield 52. An O-ring 64 is held compressed between the second shield 62 and the flow through shaft 22. Just as the first shield 52 provides a virtual seal by means of a labyrinthine gap between the first shield and a back end of the housing 40, the second shield 62 provides a labyrinthine gap functioning as a virtual seal relative to a front end of the housing 40. As in the case of the first shield, the gap between the second shield 62 and the outer surface of the housing 40 is about 0.030 inch wide. Like the gap between the first shield 52 and the housing 40, the gap between the second shield 62 and the housing 40 has a right angle portion which renders the gap labyrinthine.

The first shield 52 is provided to protect the housing 40 from cleaning liquid that may back up into the interior of the bearing assembly block 44 between the flow through shaft 22 and the tube 30. The second shield 62 is to protect the housing 40 from cleaning liquid that may splash or migrate toward the bearing assembly block 44 from the direction of the scrubber brush (not shown) installed at the end 26 of the flow through shaft 22.

A nut 66 is secured to an inner end 68 of flow through shaft 22 via threads on the shaft 22. The nut 66 holds the shield 52, the housing 40, and the components mounted within the housing 40 on the shaft 22. A spacer 70 is positioned between the shield 52 and the nut 66. A spring washer, which is not separately shown, holds the nut 66 in place.

A cover 72 is provided at the front side of the bearing assembly block 44 to hold the bearing assembly including the flow through shaft 22 in the bearing assembly block 44.

A spring-loaded brush holder 74 is positioned on the front half of the flow through shaft 22 for rotation with the flow through shaft 22. The brush holder 74 includes a spring 76 contained within a fixed casing half 78 and a movable casing half 80. An O-ring 82 holds the brush holder 74 on the flow through shaft 22.

In operation, a brush is mounted on the brush holder 74 by moving the movable casing-half 80 in a rightward direction to compress the brush holder 74. The compression of the spring 76 causes the movable casing-half 80 to apply a force to the brush (not shown) to hold the brush between the mounting assembly 20 and a motor-driven mounting assembly (not shown) which holds an opposite end of the brush.

A wafer is placed in the scrubber, and the two brushes of the scrubber are moved into the configuration shown in FIG. 1. Each of the brushes is held between two mounting assemblies, of which one is illustrated in FIG. 2. The brush (not shown in FIG. 2) mounted on the assembly of FIG. 2 is driven to a rotary motion by a motor-driven mounting assembly (not shown) which holds the other end of the brush. The resulting rotational force is transmitted from the brush through the brush holder 74 to the flow through shaft 22, which accordingly rotates at high speed, for example, up to 700 rpm. Rotating with the shaft 22 are the shields 52 and 62. Housing 40 and bearings 38, 39 remain at rest, as does the tube 30. Cleaning liquid flows from a cleaning liquid supply (not shown) through the liquid supply channel 36, the tube 30 and the flow through shaft 22. The cleaning liquid is supplied to the wafer through perforations in the scrubber brush mandrel.

Because the flow through shaft 22 rotates at high speed while the tube 30 remains stationary, and because the gap between the flow through tube 22 and the tube 30 is quite narrow, on the order of a few thousandths of an inch, and extends a relatively long distance (e.g., about 100 times the dimension of the gap), the labyrinthine dimensioning of the gap discourages cleaning liquid from backing up through the gap into the bearing assembly block 44. However, if cleaning liquid does back up between the tube 30 and the flow through shaft 22, the drainage opening 60 in the bearing assembly block 44 provides a low resistance path for the cleaning liquid to travel, in preference to the high resistance to liquid flow provided by labyrinthine gap formed between the first shield 52 and the housing 40. Accordingly, any backed-up cleaning liquid will tend to flow out the drainage opening 60 rather than through the gap between the shield 52 and the housing 40.

It is noted that the shield 52 spins at high speed with the flow through shaft 22. This, together with the narrow labyrinthine right-angled gap between the shield 52 and the housing 40, forms a virtual or labyrinth seal to prevent cleaning liquid from entering the housing 40 from the back end 68 of the flow through shaft 22.

In a similar fashion, the second shield 62 protects the other side of the housing 40 from cleaning liquid that may splash toward the bearing assembly block 44 from the scrubbing operations carried out by the brushes.

By providing a labyrinthine virtual seal to protect the bearings instead of providing a physical seal, the following disadvantages of a physical seal are avoided: possible deterioration of the seal with generation of particulate contaminants, and potential failure of the seal which could result in contamination of the bearings with cleaning liquid and in failure of the bearings and the entire mounting assembly.

The mounting assembly design illustrated herein, which combines a spinning shield at the back end of the flow through shaft, together with a drainage path adjacent the back end of the flow through shaft, has been found to be highly effective in protecting the bearings from cleaning liquid, and conversely in preventing contamination of the cleaning liquid by lubricant from the bearings. Consequently, the brush mounting assembly described herein may have a long life and experience minimal down time, thereby contributing to an economical wafer scrubber unit.

The foregoing description discloses only a preferred embodiment of the invention; modifications of the above disclosed apparatus which fall within the scope of the invention will be readily apparent to those of ordinary skill in the art. For instance, it is contemplated to omit either one of the spinning shields and the corresponding labyrinth seal, and to replace the same with a physical seal. Likewise, it is contemplated to provide a physical seal between the tube 30 and the flow through shaft 22, in lieu of the labyrinth seal provided therebetween. It will be understood that the gaps defined between each shield and the housing may include angled portions having angles other than the right angle shown herein. Each gap may include a plurality of angled portions.

Accordingly, while the present invention has been disclosed in connection with the preferred embodiments thereof, it should be understood that other embodiments may fall within the spirit and scope of the invention, as defined by the following claims.

The invention claimed is:

1. A mounting assembly for a wafer-scrubber brush, comprising:
   a first tube that is fixedly mounted and has a bore in which a cleaning liquid flows;
   a second tube having a bore in which the first tube is inserted;
   at least one bearing adapted to mount the second tube for rotational motion;
   a housing in which the at least one bearing is fixedly mounted;
   a first shield mounted on the second tube and adapted to rotate with the second tube, the first shield defining a gap between the first shield and the housing, the gap being dimensioned so as to discourage flow of the cleaning liquid in the gap;
   an assembly block in which the housing is mounted; and
   a drainage opening formed in the assembly block, the drainage opening extending from a location adjacent the first shield.

2. The mounting assembly of claim 1, wherein the drainage opening extends downwardly from the location adjacent the first shield.

3. The mounting assembly of claim 1, further comprising a second shield mounted on the second tube and adapted to rotate with the second tube, the second shield being located at an opposite side of the housing relative to the first shield, the second shield defining a second gap between the second shield and the housing, the second gap being dimensioned so as to discourage flow of the cleaning liquid in the second gap.

4. The mounting assembly of claim 1, wherein the gap defined between the first shield and the housing includes at least one angled portion defined between a corner of the first shield and a corner of the housing.

5. The mounting assembly of claim 4, wherein at least one angled portion has a right angle.

6. The mounting assembly of claim 1, wherein the at least one bearing includes a pair of bearings mounted in the housing in a spaced relationship relative to each other.

7. The mounting assembly of claim 1, further comprising a fixture mounting adapted to flexibly mount the housing to the assembly block.

8. The mounting assembly of claim 1, wherein the bore of the second tube and an outer surface of the first tube define therebetween a third gap that is dimensioned so as to discourage flow of cleaning liquid in the third gap.

9. The mounting assembly of claim 1, further comprising a mechanism attached to the second tube and adapted to mount a scrubber brush.

10. The mounting assembly of claim 1, wherein the drainage opening extends from a location adjacent a bottom end of the first shield.

11. The mounting assembly of claim 1, wherein the drainage opening is adapted to drain cleaning fluid that has backed up into an interior of the assembly block between the first and second tubes.

12. The mounting assembly of claim 11, wherein the drainage opening provides a path for a cleaning liquid to travel that is of a low resistance compared to the gap between the first shield and the housing, so as to cause a cleaning liquid that has backed up into the interior of the assembly block to flow out of the assembly block via the drainage opening rather than via the gap between the shield and the housing.

13. A mounting assembly for a wafer-scrubber brush, comprising;
   a housing;
   at least one bearing mounted in the housing;
   a flow through shaft rotatably mounted on the at least one bearing, adapted to allow a liquid to flow through in the flow through shaft;

a pair of shields mounted on the flow through shaft on opposite sides of the housing, each shield adapted to define a gap With a respective side of the housing, the gaps being dimensioned so as to discourage flow of liquid in the gaps;

an assembly block in which the housing is mounted; and a drainage opening formed in the assembly block, the drainage opening extending from a location adjacent a first shield of the pair of shields.

14. The mounting assembly of claim 13, wherein each of the gaps has at least one angled portion.

15. The mounting assembly of claim 14, wherein at least one angled portion has a right angle.

16. The mounting assembly of claim 13, further comprising a mechanism attached to the flow through shaft and adapted to mount a scrubber brush.

17. The mounting assembly of claim 13, wherein the drainage opening extends from a location adjacent a bottom end of the first shield.

18. The mounting assembly of claim 13, wherein the drainage opening is adapted to drain cleaning liquid that has backed up into an interior of the assembly block.

19. The mounting assembly of claim 18, wherein the drainage opening provides a path for a cleaning liquid to travel that is of a low resistance compared to the gap between the first shield and the housing, so as to cause a cleaning liquid that has backed up into the interior of the assembly block to flow out of the assembly block via the drainage opening rather than via the gap between the first shield and the housing.

20. A mounting assembly for a wafer-scrubber brush, comprising:

a flow through shaft adapted to have a cleaning liquid flowing therein, a bearing adapted to mount the flow through shaft for rotation around a longitudinal axis of the flow through shaft;

a housing in which the bearing is mounted;

a shield mounted on the flow through shaft for rotation therewith and adapted to define a gap relative to the housing, the gap being dimensioned so as to discourage flow of cleaning liquid in the gap;

an assembly block in which the housing is mounted; and a drainage opening formed in the assembly block, the drainage opening extending from a location adjacent the shield.

21. The mounting assembly of claim 20, wherein the housing and the shield have respective corners defining therebetween at least one angled portion of the gap.

22. The mounting assembly of claim 21, wherein at least one angled portion has a right angle.

23. The mounting assembly of claim 20, further comprising a mechanism attached to the flow through shaft and adapted to mount a scrubber brush.

24. The mounting assembly of claim 20, wherein the drainage opening extends from a location adjacent a bottom end of the shield.

25. The mounting assembly of claim 20, wherein the drainage opening is adapted to drain cleaning liquid that has backed up into an interior of the assembly block.

26. The mounting assembly of claim 25, wherein the drainage opening provides a path for a cleaning liquid to travel that is of a low resistance compared to the gap between the shield and the housing, so as to cause a cleaning liquid that has backed up into the interior of the assembly block to flow out of the assembly block via the drainage opening rather than via the gap between the shield and the housing.

27. A mounting assembly for a wafer-scrubber brush, comprising:

a first tube that is fixedly mounted and has a bore in which a cleaning liquid flows;

a second tube having a bore in which the first tube is inserted;

at least one bearing adapted to mount the second tube for rotational motion;

a housing in which the at least one bearing is fixedly mounted;

a first shield mounted on the second tube and adapted to rotate with the second tube, the first shield defining a gap between the first shield and the housing, the gap being dimensioned so as to discourage flow of the cleaning liquid in the gap;

an assembly block in which the housing is mounted; and a flexure mounting adapted to flexibly mount the housing to the assembly block.

* * * * *